United States Patent [19]

Ochii

[11] Patent Number: 4,612,631

[45] Date of Patent: Sep. 16, 1986

[54] STATIC TYPE SEMICONDUCTOR MEMORY CIRCUIT

[75] Inventor: Kiyofumi Ochii, Yokohama, Japan

[73] Assignee: Tokyo Shibaura Denki Kabushiki Kaisha, Japan

[21] Appl. No.: 592,796

[22] Filed: Mar. 23, 1984

[30] Foreign Application Priority Data

Mar. 30, 1983 [JP] Japan .................................. 58-54323

[51] Int. Cl.$^4$ ................................................ G11C 7/00
[52] U.S. Cl. ...................................... 365/203; 365/230
[58] Field of Search ............... 365/189, 190, 203, 205, 365/207, 230, 233

[56] References Cited

U.S. PATENT DOCUMENTS 4,405,996 9/1983 Stewart ................................. 365/203
4,417,328 11/1983 Ochii .................................... 365/203

OTHER PUBLICATIONS

Stewart, "High–Density CMOS ROM Arrays", IEEE Journal of Solid–State Circuits vol. SC–12, No. 5, Oct. 1977.

Ochii et al., "An Ultralow Power 8K×8-Bit Full CMOS RAM with a Six-Transistor Cell", IEEE Journal of Solid–State Circuits, vol. SC-17, No. 5, Oct. 1982.

Hardee et al., "A Fault-Tolerant 30 ns/375 mW 16K×1 NMOS Static RAM", IEEE Journal of Solid–State Circuits, vol. SC-16, No. 5, Oct. 1981.

Primary Examiner—Joseph A. Popek
Attorney, Agent, or Firm—Finnegan, Henderson, Farabow, Garrett & Dunner

[57] ABSTRACT

A static type memory circuit has a plurality of memory cells arranged in a matrix form, a plurality of word lines and a plurality of pairs of bit lines, each of the word lines being coupled to memory cells on a corresponding row, each pair of the bit lines being commonly coupled to memory cells on a corresponding column, a sense amplifier circuit coupled to the bit lines, a row decoder for energizing one of the word lines in response to row address data, a transition detecting circuit for generating an output signal when the row address data is changed, a control signal generator for causing the sense amplifier circuit to be active in response to the output signal from the transition detecting circuit, and a precharge control circuit for controlling precharging of the bit lines in response to the output signal from the transition detecting circuit. The precharge control circuit precharges the bit line to "1" level potential when the sense amplifier circuit is rendered nonoperative in response to the output signal from the control signal generator, and stops the precharging operation in response to an output signal from the transition detecting circuit.

11 Claims, 27 Drawing Figures

STATIC TYPE SEMICONDUCTOR MEMORY CIRCUIT

BACKGROUND OF THE INVENTION

The present invention relates to a static type semiconductor memory circuit for precharging or equalizing bit lines or data input/output lines to read out data from memory cells.

In a conventional static type memory, a pair of bit lines are commonly connected to memory cells of each column, and the pair of bit lines are precharged before reading out data from the memory cells of the corresponding column.

FIG. 1 is a circuit diagram of a conventional static type memory. The memory has a memory cell MC and a sense amplifier SA1 which are commonly coupled to a pair of bit lines BL1 and BL0. The memory cell MC includes a flip-flop constituted by a series circuit of p- and n-channel MOS transistors TR1 and TR2 connected between power supply terminals VC and VS and a series circuit of p- and n-channel MOS transistors TR3 and TR4 connected between the power supply terminals VC and VS, a MOS transistor TR5 coupled between the bit line BL1 and one bistable terminal of the flip-flop, and a MOS transistor TR6 connected between the bit line BL0 and the other bistable terminal of the flip-flop.

The sense amplifier SA1 includes a transistor TR7 which is turned on or off in response to an output signal from a control signal generator 1 and which has a current path which is coupled at one end to the power supply terminal VS. SAL also includes a flip-flop constituted by a series circuit of p- and n-channel MOS transistors TR8 and TR9 connected between the other end of the current path of TR7 and the power supply terminal VC, and a series circuit of p- and n-channel MOS transistors TR10 and TR11 connected between the other end of the current path and the power supply terminal VC. The bistable terminals of the flip-flop are connected to the bit lines BL1 and BL0, respectively.

This static type memory also has a row decoder 2 for generating a row selection signal in response to row address data, and a transition detecting circuit 3 for generating an output signal TDS when it detects that the row address data has been changed.

The bit lines BL1 and BL0 are coupled to the power supply terminal VC through p-channel MOS transistors TR12 and TR13, respectively.

The operation of this static type memory will be described with reference to FIGS. 2A to 2E.

As shown in FIG. 2A, when the row address data is changed, an output signal TDS of high level is generated from the transition detecting circuit 3 for a predetermined period of time. An inverted signal $\overline{TDS}$ of the output signal TDS is supplied to the gates of the MOS transistors TR12 and TR13 so that the bit lines BL1 and BL0 are precharged through the MOS transistors TR12 and TR13 and are set at a potential corresponding to the VCC level. The control signal generator 1 generates an output signal of low level for a predetermined period of time, as shown in FIG. 2E, in response to the output signal TDS from the transition detecting circuit 3, thereby turning off the MOS transistor TR7.

When the row decoder 2 receives predetermined address data, it generates a energizing signal shown in FIG. 2F after precharging of the bit lines BL1 and BL0 is completed, so that the word line is energized. The MOS transistors TR5 and TR6 in the memory cell MC are then turned on, and one of the bit lines BL1 and BL0 starts discharging toward the reference potential level VSS, as shown in FIG. 2D, in accordance with the potentials at the bistable terminals of the flip-flop of the memory cell MC (i.e., in accordance with the content of the memory cell MC). At the discharge timing of the bit line BL1 or BL0, the control signal generator 1 generates a high level signal, as shown in FIG. 2E, to turn on the MOS transistor TR7. The sense amplifier SA is set in the operative mode. The conduction states of the MOS transistors TR8 to TR11 of the sense amplifier SA1 are determined in accordance with the potentials at the bit lines BL1 and BL0. As a result, the potential at one of the bit lines BL1 and BL0 abruptly decreases to the VSS level, as shown in FIG. 2D. A change in potential of one of the bit lines BL1 and BL0 is supplied as memory data to an external circuit.

FIG. 3 is a circuit diagram showing the detailed arrangement of the transition detecting circuit 3 shown in FIG. 1. The transition detecting circuit 3 includes N detectors 30-1 to 30-N for detecting changes in logic levels of the respective bits of the row address data, n-channel MOS transistors TR14-1 to TR14-N whose gates are respectively coupled to the output terminals of the detectors 30-1 to 30-N and whose current paths are connected in parallel with each other, a p-channel load MOS transistor TR15 whose current path is coupled at one end to the power supply terminal VC and at the other end to the reference power supply terminal VS through the MOS transistors TR14-1 to TR14-N, and an inverter 31 which has an input terminal coupled to the juncture between the MOS transistor TR15 and the MOS transistors TR14-1 to 14-N.

In this transition detecting circuit, when the row address data is changed, at least one of the detectors 30-1 to 30-N generates a high level output for a predetermined period of time. The corresponding one or ones of the MOS transistors TR14-1 to TR14-N are turned on, so that the inverter 31 generates the transition detection signal TDS of high level for the predetermined period of time.

In the static type memory shown in FIG. 1, when the row address data is changed, the transition detecting circuit 3 causes the corresponding transistor to generate the transition detection signal through the inverter. When this transition detection signal is generated, the bit lines BL1 and BL0 are precharged, so that data is read out from the memory cell MC. Data read access cannot be performed before the bit lines BL1 and BL0 are precharged. Assume that the access time from the changing of the row address data to the end of memory data access is 70 nsec. In general, it takes about 10 nsec to precharge the bit lines BL1 and BL0. Therefore, the precharge time is about 15% of the total access time. In this manner, in the conventional static type memory, the bit lines must be precharged at the initial period of the memory cycle, thereby increasing the total access time.

In addition, since a large number of memory cells are connected to the bit lines BL1 and BL0, a large load capacitance is associated with the bit lines BL1 and BL0. For this reason, in order to complete precharging operation within about 10 nsec, MOS transistors having a large current drive capacity must be used as the MOS transistors TR12 and TR13, respectively. In this case, a large peak current flows through the MOS transistors TR12 and TR13. In some cases, a current larger than 100 mA may flow through the transistors TR12 and TR13. This large current induces a current or voltage in the memory, thereby erroneously operating the memory and influencing various characteristics of the memory.

FIG. 4 shows another conventional static type memory. This memory is substantially the same as that of FIG. 1, except that a sense amplifier SA2 is used in place of the sense amplifier SA1, that a potential setting circuit PSC is used to set the potentials of data lines DL1 and DL0, and that a p-channel MOS transistor TR16 is coupled between the bit lines BL1 and BL0 and a p-channel MOS transistor TR17 is coupled between a pair of data lines DL1 and DL0. The potential setting circuit PSC has p-channel MOS transistors TR18 and TR19 coupled between a power supply terminal VC and the data lines DL1 and DL0. The sense amplifier SA2 includes n-channel MOS transistors TR20 and TR21. One end of the current path of each of the transistors TR20 and TR21 is coupled to a corresponding one of the data lines DL1 and DL0, and the other end thereof is coupled to the power supply terminal VS through an n-channel MOS transistor TR22. The gates of the MOS transisotrs TR12 and TR13 are coupled to the power supply terminal VS. An inverted signal of the transition detection signal TDS from the transition detecting circuit 3 is supplied to the gates of the MOS transistors TR16 and TR17. The gates of the MOS transistors TR20 and TR21 are coupled to the bit lines BL1 and BL0, respectively.

In this static type memory, the bit lines BL1 and BL0 are held at a potential of level "0" through the MOS transistors TR12 and TR13, respectively. The data lines DL1 and DL0 are held at a potential of "1" level through the MOS transistors TR18 and TR19, respectively, of the potential setting circuit PSC. When the row address data is updated and the transition detection signal is generated from the transition detecting circuit 3, the MOS transistors TR16 and TR17 are turned on. The potentials at the bit lines BL1 and BL0 are equalized (i.e., the potential at the bit line BL1 is made equal to that at the bit line BL0). At the same time, the potentials at the data lines DL1 and DL0 are equalized. After such initialization is completed, the MOS transistors TR16 and TR17 are turned off. In the same manner as described above, the word lines are energized by the output signal from the row decoder 2, so that the data is read out from the memory cell MC onto the bit lines BL1 and BL0. During this readout operation, the sense amplifier SA2 is set in the operative mode in response to the output signal from the control signal generator 1. As a result, the data corresponding to the readout data is supplied onto the data lines DL1 and DL0.

In the static type memory shown in FIG. 4, the potentials at the bit lines BL1 and BL0 and the potentials at the data lines DL1 and DL0 are equalized at the beginning of each readout cycle. The equalizing time cannot be neglected and increases the total access time.

SUMMARY OF THE INVENTION

It is an object of the present invention to provide a semiconductor memory circuit capable of shortening the read access time to accomplish high-speed operation.

In order to achieve the above object of the present invention, there is provided a semiconductor memory circuit comprising a plurality of memory cells, a plurality of word lines and bit lines which are coupled to the plurality of memory cells to select at least one of the plurality of memory cells, a sense amplifier circuit coupled to the plurality of bit lines, a transition detecting circuit for generating an output signal when the transition detecting circuit detects that address data is changed, a word line selection circuit for selecting at least one of the plurality of word lines in response to the address data, a control circuit for supplying a control signal to the sense amplifier circuit to set the sense amplifier circuit in an operative mode in response to an output signal from the transition detecting circuit, a data holding circuit arranged to hold data read out from the memory cells through the plurality of bit lines, and a potential setting circuit for setting potentials of the bit lines to an initial potential level within a given memory cycle after the data read out from the memory cells within the given memory cycle is held by the data holding circuit.

According to the present invention, the bit line is set to be at the initial potential level after the memory data is accessed. In the next memory cycle, the bit line need not be set to the initial potential level, and the word lines can be selectively energized in response to the address data. Therefore, the access time can be shortened in the data readout mode.

DETAILED DESCRIPTION OF THE PREFERRED EMBODIMENT

Figure 5:
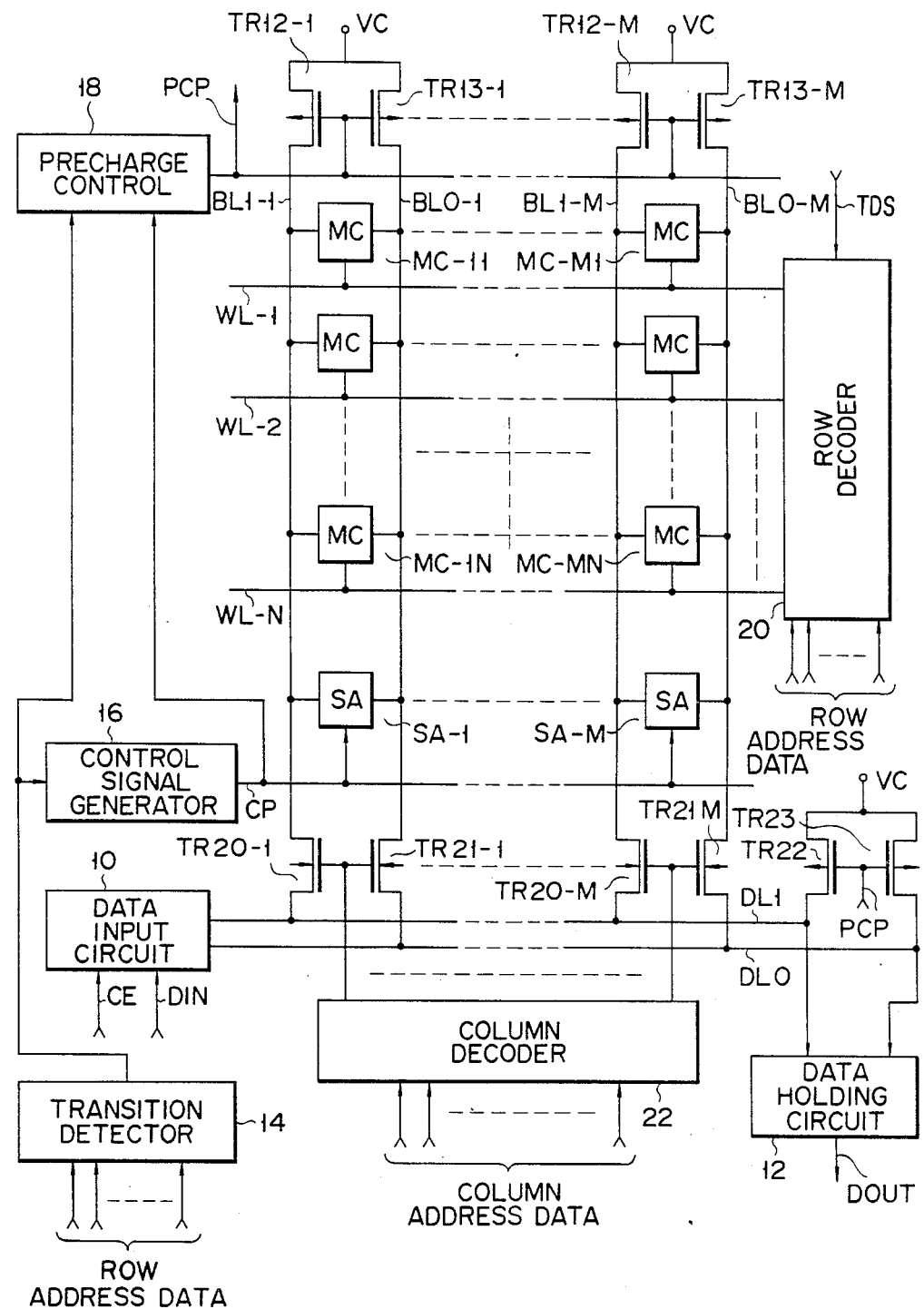
FIG. 5 is a circuit diagram of a semiconductor memory according to an embodiment of the present invention.

FIG. 5 shows a semiconductor memory circuit according to an embodiment of the present invention. This memory circuit includes M×N memory cells MC-11 to MC-MN arranged in a matrix form, word lines WL-1 to WL-N, each of which is commonly coupled to memory cells on a corresponding row, a plurality of pairs of bit lines BL1-1 and BL0-1, . . . , and BL1-M, and BL0-M each pair of which are connected to memory cells on a corresponding column, and sense amplifiers SA-1 to SA-M respectively coupled to the bit line pairs BL1-1 and BL0-1, . . . , to BL1-M and BL0-M. Each of the memory cells MC-11 to MC-MN is arranged in the same manner as the memory cell MC of FIG. 1, and each of the sense amplifiers SA-1 to SA-M is also arranged in the same manner as the sense amplifier SA1 of FIG. 1. One end of each of the bit lines BL1-1 to BL1-M is coupled to the data line DL1 through a corresponding one of MOS transistors TR20-1 to TR20-M, and the other end thereof is coupled to a power supply terminal VC through a corresponding one of MOS transistors TR12-1 to TR12-M. Similarly, one end of the bit lines BL0-1 to BL0-M is coupled to the data line DL0 through a corresponding one of MOS transistors TR21-1 to TR21-M, and the other end thereof is coupled a power supply terminal VC through a corresponding one of MOS transistors TR13-1 to TR13-M. The pair of data lines DL1 and DL0 are coupled to a data input circuit 10 for supplying data thereto in response to a chip enable signal CE and input data DIN. At the same time, the data lines DL1 and DL0 are coupled to a data holding circuit 12 for holding data appearing on the data lines DL1 and DL0. In addition, these data lines DL1 and DL0 are coupled to the power supply terminal VC through p-channel MOS transistors TR22 and TR23, respectively.

Figure 1:
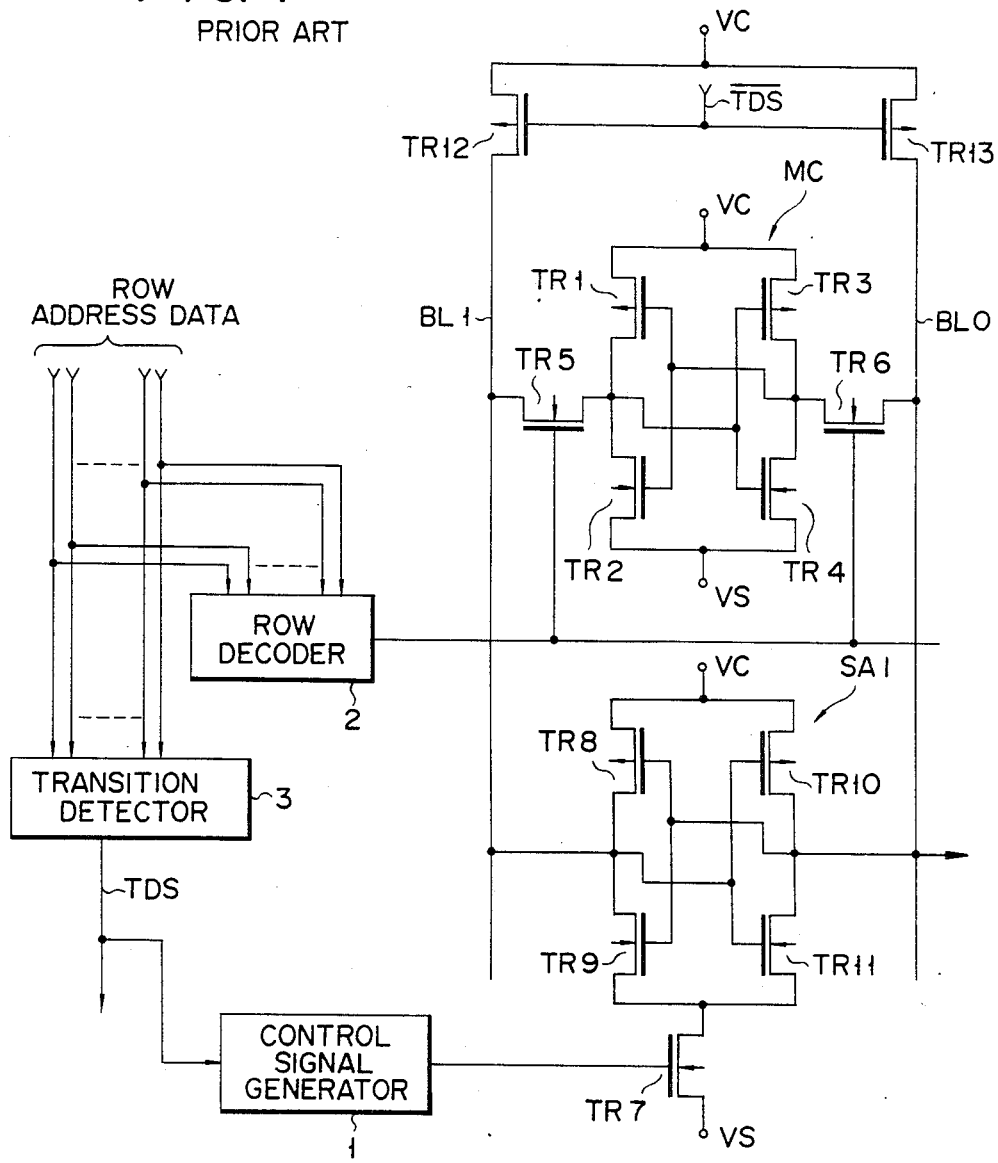
FIG. 1 is a circuit diagram of a conventional static type memory.
Figure 2:
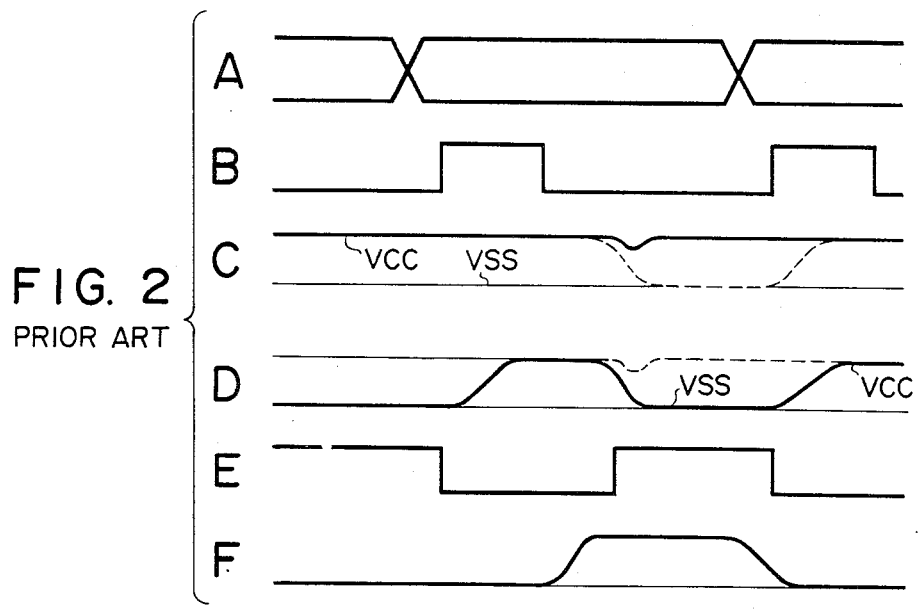
FIGS. 2A to 2F show a timing chart for explaining the operation of the static type memory shown in FIG. 1.
Figure 3:
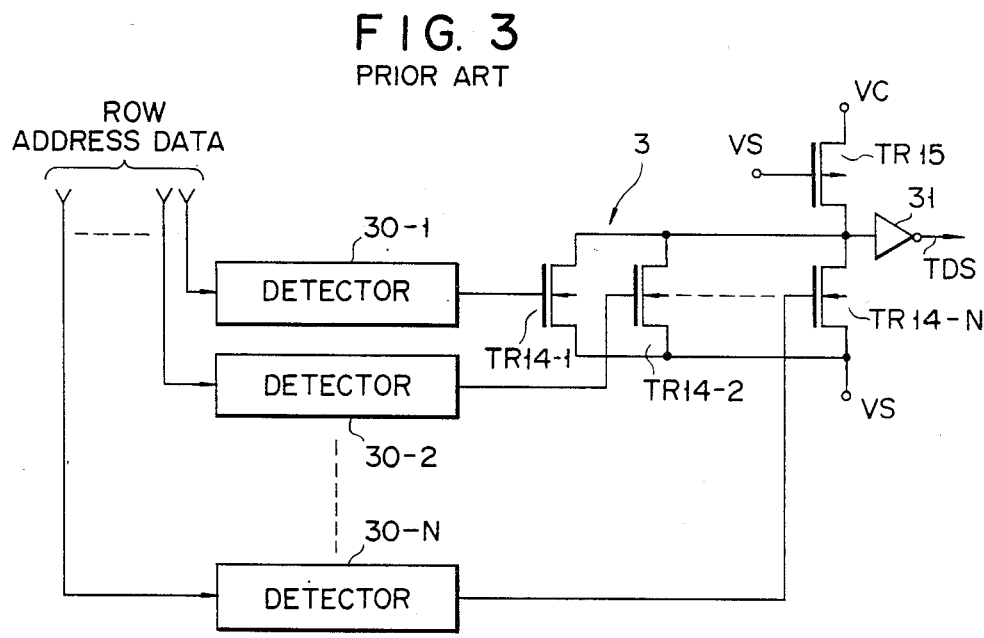
FIG. 3 is a circuit diagram showing a transition detecting circuit used in the static type memory of FIG. 1.

This memory device further includes a transition detecting circuit 14 having the same arrangement as the transition detecting circuit 3 of FIG. 1, a control signal generator 16 for generating a control signal to set the sense amplifiers SA-1 to SA-M in an operative mode in response to the transition detection signal TDS supplied from the transition detecting circuit 14, a precharge control circuit 18 for controlling the conduction states of the MOS transistors TR12-1 to TR12-M and TR13-1 to TR13-M in response to output signals from the transition detecting circuit 14 and the control signal generator 16, a row decoder 20 for energizing one of the word lines WL-1 to WL-N in response to row address data, and a column decoder 22 for turning on one pair of the MOS transistors TR20-1 and TR21-1, . . . , or TR20-M and TR21-M in response to column address data.

The operation of the memory circuit shown in FIG. 5 will be described with reference to the timing chart of FIGS. 6A to 6J.

Figure 6A:
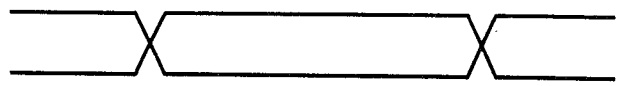
FIGS. 6A to 6J show a timing chart for explaining the semiconductor memory circuit of FIG. 5.
Figure 6B:
Figure 6C:

Assume that the address data from an address designation circuit (not shown) is updated and thus the row address data is changed, as shown in FIG. 6A. The transition detection circuit 14 generates the transition detection signal TDS, as shown in FIG. 6B. The precharge control circuit 18 generates a precharge control pulse PCP having a predetermined pulse duration, as shown in FIG. 6C, in response to the transition detection signal TDS supplied from the transition detecting circuit 14, so that the MOS transistors TR12-1 to TR12-M, TR13-1 to TR13-M, TR22 and TR23 are turned off. The bit lines BL1-1 to BL1-M and BL0-1 to BL0-M are precharged to a potential of level "1" through the MOS transistors TR12-1 to TR12-M and TR13-1 to TR13-M, respectively. Similarly, the data lines DL1 and DL0 are precharged to the potential of level "1" through the MOS transistors TR22 and TR23, respectively. Therefore, these bit and data lines are held at the potential of logic level "1" immediately after these MOS transistors are turned off.

Figure 6D:
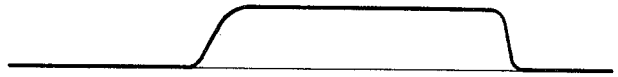
Figure 6E:
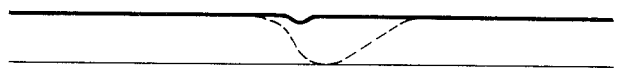
Figure 6F:
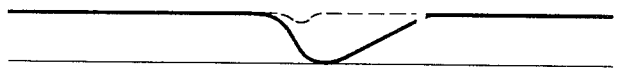

The row decoder 20 sets one of the word lines WL-1 to WL-N, for example, the word line WL-1 selected in accordance with the input row address data, to a high potential level, as shown in FIG. 6D, in response to the transition detection signal TDS supplied from the transition detecting circuit 14. Therefore, a potential of the bit lines BL1-1 to BL1-M and BL0-1 to BL0-M changes, as shown in FIGS. 6E or 6F, in accordance with the contents of the memory cells MC-11 to MC-M1 coupled to the selected word line WL-1. For example, when the potential at the bit line BL1-1 is held at level "1", as shown in FIG. 6E, in accordance with the memory data of the memory cell MC-11, the potential at the bit line BL0-1 decreases toward level "0", as shown in FIG. 6F.

Figure 6G:
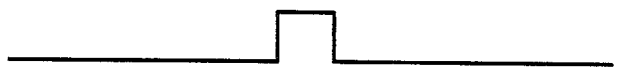
Figure 6H:
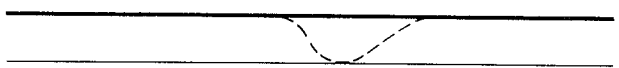
Figure 6I:
Figure 6J:

The control signal generator 16 generates a control pulse CP having a predetermined pulse duration shown in FIG. 6G when a predetermined period of time has elapsed (i.e., when the potential at the bit line BL0-1 decreases). The sense amplifiers SA-1 to SA-M are set in the operative mode, so that one of the paired bit lines is held at the potential of the "1" level, as shown in FIG. 6E, while the potential of the other bit line abruptly decreases toward the "0" level, as shown in FIG. 6F. Assume that the column decoder 22 generates an output signal to turn on the transistors TR20-1 and TR21-1 in accordance with the column address data. In this case, since the bit line BL1-1 is set at the "1" level potential, the data line DL1 is held at the "1" level potential, as shown in FIG. 6H. However, the potential at the data line DL0 decreases toward the "0" level potential following the decrease in potential of the bit line BL1-0, as shown in FIG. 6I. The data holding circuit 12 holds data corresponding to a difference between the potentials at the data lines DL1 and DL0, as shown in FIG. 6J. The data holding circuit 12 then generates output data DOUT corresponding to this potential difference.

When the control pulse CP from the control signal generator 16 is set to level "0", the precharge control circuit 18 sets the output pulse PCP at "0" level. The MOS transistors TR12-1 to TR12-M, TR13-1 to TR13-M, TR22 and TR23 are turned on, so that all the bit and data lines are precharged again to level "1". In this manner, at the end of the given memory cycle, the potentials at the bit lines BL1-1 to BL1-M and BL0-1 to BL0-M and data lines DL1 and DL0 are held at "1" level. Therefore, when the row address data is changed and the next readout memory cycle is started, the data readout operation can be performed in the same manner as described above. In addition, the data holding circuit 12 holds data corresponding to the readout data, so that even after the data lines DL1 and DL0 are precharged at the "1" level potential, its output data DOUT will not be changed.

In the memory circuit shown in FIG. 5, while the data holding circuit 12 holds the data and transfers it to an external circuit (not shown), the bit lines BL1-1 to BL1-M and BL0-1 to BL0-M and the data lines DL1 and DL0 are precharged to the "1" level potential, thereby preparing for the readout operation of the next memory cycle. Therefore, in the next memory cycle, the readout operation is performed by selectively energizing the word lines WL-1 to WL-N immediately after the transition detection signal TDS is generated from the transition detecting circuit 14, and activating the sense amplifiers SA-1 to SA-M after the predetermined period of time has elapsed. That is, the readout operation can be performed without precharging the bit lines at the initial period of each memory access cycle. Therefore, the readout access time of the memory circuit can be shortened.

In addition, bit line precharging can be performed within a given period after the data holding circuit 12 holds the readout data in a given readout memory cycle and before the next readout memory cycle is started. For example, in a typical memory, this given period is about 20 nsec and is about twice the precharge period (about 10 nsec) of the memory shown in FIG. 1. Therefore, in the memory circuit shown in FIG. 5, the bit and data lines can be precharged to the "1" level within a relatively long interval. It is not necessary to cause a large current to flow through the MOS transistors TR12-1 to TR12-M, TR13-1 to TR13-M, TR22 and TR23. In addition, this memory circuit will not be erroneously operated due to noise generated by the peak current flowing through these MOS transistors.

Figure 7:
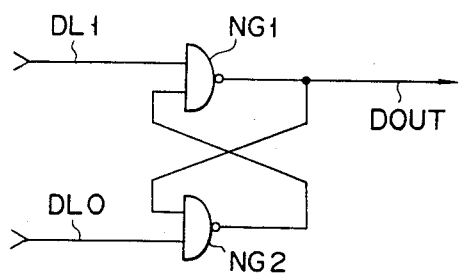
FIG. 7 is a circuit diagram of a data holding circuit used in the semiconductor memory circuit of FIG. 5.

FIG. 7 is a circuit diagram showing the data holding circuit 12 used in the memory circuit of FIG. 5. This data holding circuit includes a flip-flop constituted by NAND gates NG1 and NG2 each of which has two input terminals. One input terminal of the NAND gate NG0 is connected to the data line DL0, and one input terminal of the NAND gate NG1 is connected to the data line DL1. The output terminal of the NAND gate NG1 is connected to the other input terminal of the NAND gate NG2, and the output terminal of the NAND gate NG2 is connected to the other input terminal of the NAND gate NG1. Assume that the data lines DL1 and DL0 are precharged to the "1" level potential, and that output data DOUT is generated from the NAND gate NG1. In this state, when data is read out from a certain memory cell and the potential at the data line DL0 decreases toward the "0" level, the output signal from the NAND gate NG2 is set at the level "1", and the output signal from the NAND gate NG1 is set at the level "0". When the potential of the data line DL1 is set to the level "0" in accordance with the readout memory data, the output signal from the NAND gate NG1 is held at the level "1". Thereafter, even when the data lines DL1 and DL0 are precharged again to the "1" level, the levels of output signals of the NAND gates NG1 and NG2 will not change since the output signals from the NAND gates NG1 and NG2 are supplied to the input terminals of the NAND gates NG2 and NG1, respectively. In other words, the data fetched by the data holding circuit 12 before precharging operation can be stably held even during the precharge period.

Figure 8:
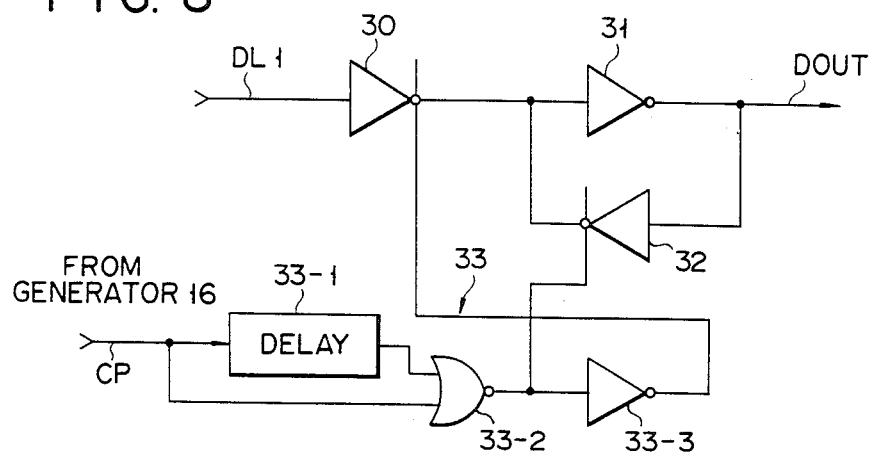
FIG. 8 is a circuit diagram showing another data holding circuit used instead of the data holding circuit of the semiconductor memory circuit of FIG. 5.

FIG. 8 shows another data holding circuit to be used in place of the data holding circuit 12. This data holding circuit includes a clocked inverter 30 coupled to the data line DL1, an inverter 31 coupled to the clocked inverter 30, a clocked inverter 32 having the input and output terminals which are respectively coupled to the output and input terminals of the inverter 31, and a clock generator 33. The clock generator 33 includes a delay circuit 33-1 for delaying the control pulse CP generated from the control signal generator 16 by a time shorter than the pulse duration of the control pulse CP, a NOR gate 33-2 for receiving an output signal from the delay circuit 33-1 and the control pulse CP and supplying a clock pulse $\overline{CL}$ to the clock gate of the clocked inverter 32, and an inverter 33-3 coupled to the NOR gate 33-2 to supply a clock pulse CL to the clock gate of the clocked inverter 30.

Figure 9A:
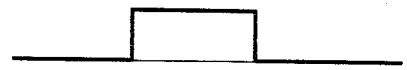
FIGS. 9A to 9D show a timing chart for explaining the operation of a clock generator used in the data holding circuit of FIG. 8.
Figure 9B:
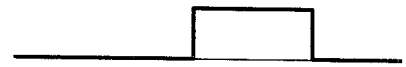
Figure 9C:
Figure 9D:
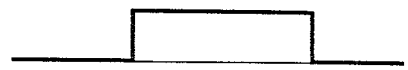

When the control pulse CP (FIG. 9A) is generated from the control signal generator 16, a pulse shown in FIG. 9B is generated from the delay circuit 33-1. The NOR gate 33-2 and the inverter 33-3 generate output signals shown in FIGS. 9C and 9D, respectively. When the output signal from the inverter 33-3 is set at high level, the clocked inverter 33-3 becomes active. The clocked inverter 30 generates the output signal determined by the potential level of the data line DL1. However, when the output signal from the inverter 33-3 becomes low, i.e., when the output signal from the NOR gate 33-2 becomes high, the clocked inverters 30 and 32 are set in the nonoperative and operative modes, respectively. An inverted signal of the output signal which is generated from the clocked inverter 30 while the output signal from the inverter 33-3 is set at high level is latched by a latch circuit constituted by the inverters 31 and 32. In this case, the clocked inverter 30 is set in the nonoperative mode, so that the data latched by the latch circuit will not be influenced by a change in potential of the data line DL1.

Figure 10:
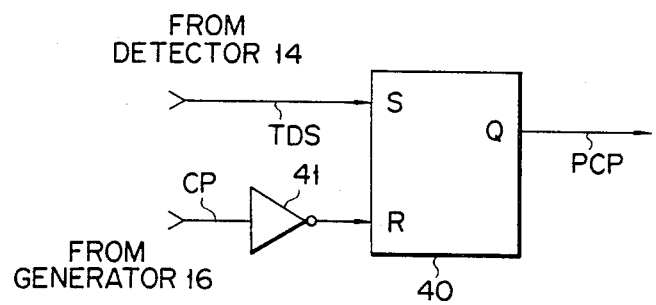
FIG. 10 is a circuit diagram of a precharge control circuit used in the semiconductor memory circuit of FIG. 5.

FIG. 10 shows a precharge control circuit 18 used in the memory circuit of FIG. 5. The precharge control circuit 18 includes an R-S flip-flop circuit 40 which receives at its set input terminal S the transition detection signal TDS supplied from the transition detecting circuit 14, and at its reset terminal R the control pulse CP generated from the control signal generator 16 through an inverter 41. The flip-flop circuit 40 is set in response to the rise of the output signal TDS from the transition detecting circuit 14 and generates a high level signal from its Q output terminal. The flip-flop circuit 40 is reset in response to the fall of the output pulse CP generated from the control signal generator 16 or the rise of the output signal from the inverter 41, and generates a low-level signal from the Q output terminal.

The present invention has been described with reference to the above embodiment. However, the present invention is not limited to the particular embodiment. For example, the MOS transistors TR12-1 to TR12-M, TR13-1 to TR13-M, TR22 and TR23 are controlled by the precharge control pulse PCP generated from the precharge control circuit 18. However, the MOS transistors TR22 and TR23 can be controlled by the transition detection signal TDS from the transition detecting circuit 14, instead of the precharge control pulse PCP.

Figure 4:
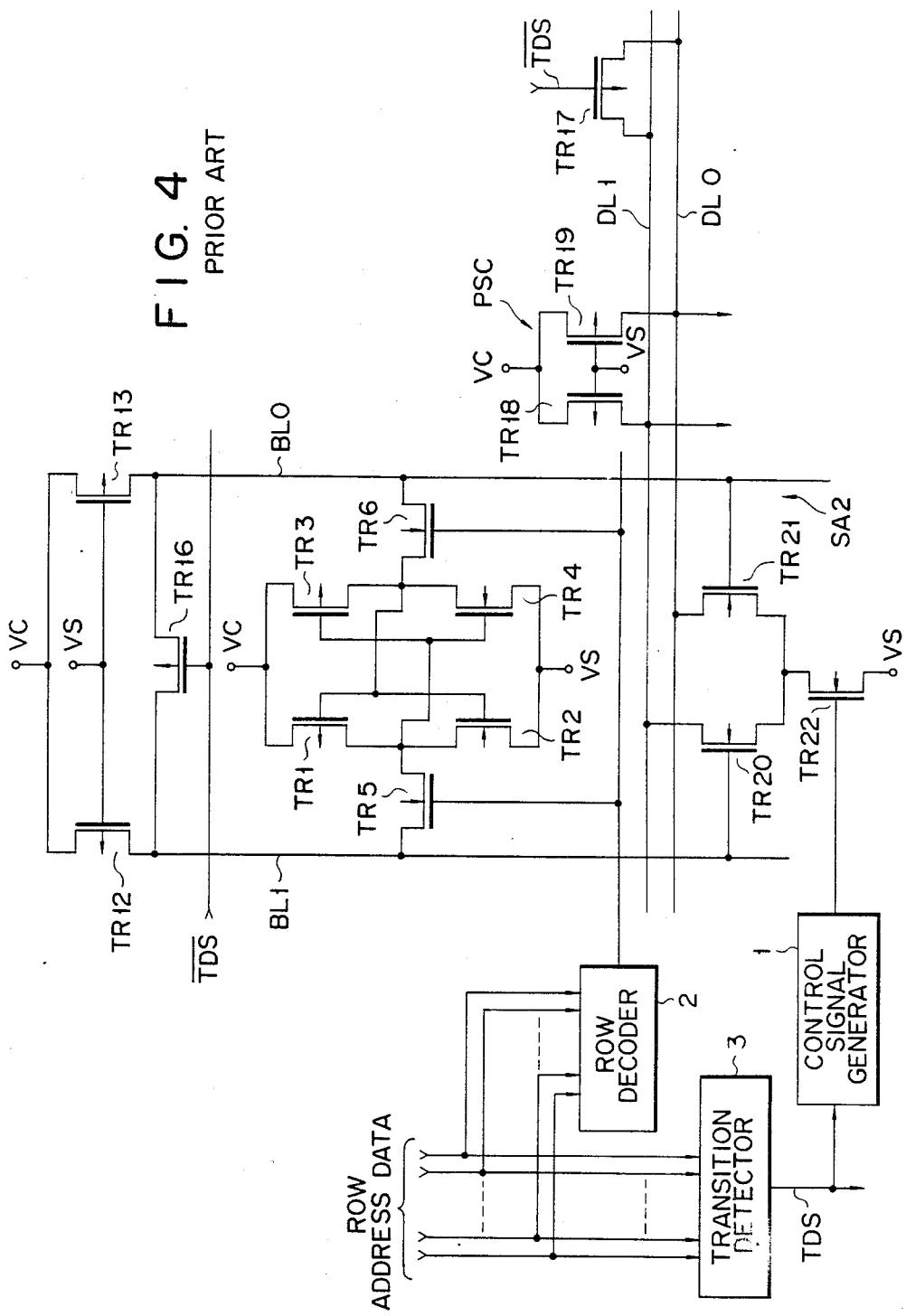
FIG. 4 is a circuit diagram of another conventional static type memory.

Furthermore, as shown in FIG. 4, the present invention can be applied to the memory using the equalizing system wherein the pair of bit lines and the pair of data lines are separately equalized. In this case, the conduction state of the MOS transistor TR16 can be controlled by the output signal PCP generated from the precharge control circuit 18, instead of the inverted signal $\overline{TDS}$ of the output signal generated from the transition detecting circuit. In other words, the MOS transistor TR16 is kept on after the sense amplifier is set in the nonoperative mode and until the high level output signal is generated from the transition detecting circuit in the next memory cycle, so that the pair of bit lines are held at the same potential. In this case, the MOS transistor TR17 can be controlled by the output signal from the precharge control circuit 18, instead of the inverted signal $\overline{TDS}$ of the transition detection signal.

Furthermore, in the above embodiment, the semiconductor memory circuit is constituted as a random access memory including the CMOS transistors. However, the semiconductor memory circuit may be constituted by monochannel MOS transistors. Alternatively, the semiconductor memory circuit may be constituted as a read-only memory.

What is claimed is:
1. A semiconductor memory circuit responsive to address data comprising:
a plurality of memory cells;

a plurality of word lines and bit lines which are connected to said plurality of memory cells to select at least one of said plurality of memory cells;
sense amplifier means coupled to said plurality of bit lines;
transition detecting means for generating an output signal when said transition detecting means detects that address data has been changed;
word line selection means for selecting at least one of said plurality of word lines in response to the address data;
control means for supplying a control signal to said sense amplifier means to set said sense amplifier means in an operative mode for a predetermined period of time in response to said output signal from said transition detecting means, thereby to cause the reading of data in a given memory cycle from said at least one selected memory cell onto those of said plurality of bit lines connected to said at least one selected memory cell;
data holding means for holding data read out from said at least one selected memory cells through those of said plurality of bit lines connected to said at least one selected memory cell; and
potential setting means for setting said bit lines to an initial potential level within said given memory cycle after the data read out from said at least one selected memory cells in the given memory cycle are held in said data holding means.

2. A circuit according to claim 1, wherein said potential setting means comprises
a plurality of switching means each of which has one end coupled to a power supply terminal and another end coupled to corresponding one of said bit lines, and
a precharge control circuit for keeping said switching means in a conductive state within a predetermined period of time in response to the output signal from said transition detecting means and the control signal from said sense amplifier control means, said predetermined line beginning after said sense amplifier means is rendered nonoperative and before a next output signal is generated from said transition detecting means.

3. A circuit according to claim 2, wherein said work line selection means includes means for selecting one of said word lines in response to said output signal from said transition detecting means.

4. A circuit according to claim 3, wherein said precharge control circuit comprises an RS flip-flop which is set in response to the transition detection signal supplied from said transition detecting means and which is reset in response to the control signal supplied from said sense amplifier control means.

5. A circuit according to claim 2, wherein said data holding means comprises at least one data line coupled to said bit lines through a switching circuit, a potential setting circuit for setting said at least one data line at a predetermined potential in response to an output signal from said precharge control circuit, and a data holding circuit for holding memory data sent through said at least one data line.

6. A circuit according to claim 5, wherein said data holding circuit comprises a flip-flop.

7. A circuit according to claim 5, wherein said data holding circuit comprises a latch for latching data appearing on said at least one data line in response to an output signal from said sense amplifier control means.

8. A circuit according to claim 1, wherein a pair of bit lines of said plurality of bit lines are coupled to said memory cells of each column;
and wherein said potential setting means comprises
load resistive means coupled between said pair of bit lines and said power supply terminal,
switching means coupled to said pair of bit lines, and
a precharge control circuit for keeping said switching means in a conductive state within a predetermined period of time after said transition detecting means and said sense amplifier means are rendered nonoperative and before a next output signal is generated from said transition detecting means.

9. A circuit according to claim 8, wherein said word line selection means includes means for selecting one of said work lines in response to said output signal from said transition detecting means.

10. A circuit according to claim 8, wherein said precharge control circuit comprises an RS flip-flop which is set in response to the transition detection signal supplied from said transition detecting means and which is reset in response to the control signal supplied from said sense amplifier control means.

11. A circuit according to claim 1, wherein said word line selection means includes means for selecting one of said word lines in response to said output signal from said transition detecting means.

* * * * *